United States Patent [19]

Schoemaker

[11] Patent Number: 5,481,492

[45] Date of Patent: Jan. 2, 1996

[54] FLOATING GATE INJECTION VOLTAGE REGULATOR

[75] Inventor: Patrick A. Schoemaker, Lemon Grove, Calif.

[73] Assignee: The United States of America as represented by the Secretary of the Navy, Washington, D.C.

[21] Appl. No.: 355,780

[22] Filed: Dec. 14, 1994

[51] Int. Cl.⁶ .................................................. G11C 11/34
[52] U.S. Cl. ................... 365/185.23; 257/314; 365/185.1
[58] Field of Search .............................. 365/185; 257/317, 257/319, 315, 320, 314

[56] References Cited

U.S. PATENT DOCUMENTS

| | | | |
|---|---|---|---|
| 4,274,012 | 6/1981 | Simko | 365/185 |
| 4,573,144 | 2/1986 | Countryman, Jr. . | |
| 4,685,083 | 8/1987 | Leuschner . | |
| 4,694,429 | 9/1987 | Tanaka et al. . | |
| 4,710,900 | 12/1987 | Higuchi . | |
| 4,723,225 | 2/1988 | Kaszubinski et al. . | |
| 4,829,482 | 5/1989 | Owen . | |
| 4,858,187 | 8/1989 | Schreck . | |
| 4,888,738 | 12/1989 | Wong et al. . | |
| 4,958,317 | 9/1990 | Terada et al. . | |
| 5,253,196 | 10/1993 | Shimabukuro et al. . | |

*Primary Examiner*—Joseph A. Popek
*Attorney, Agent, or Firm*—Harvey Fendelman; Thomas Glenn Keough; Eric James Whitesell

[57] ABSTRACT

A circuit for regulating floating gate injection voltage comprises a voltage regulator electrically coupled to a floating gate device. The floating gate device includes an electrically conductive floating gate capacitively coupled to a programming terminal by an injection capacitance and to a bias terminal by a bias capacitance. The voltage regulator establishes a substantially constant rate of charge onto the floating gate when a programming voltage is applied to the floating gate device and the voltage regulator.

15 Claims, 6 Drawing Sheets

FLOATING GATE INJECTION VOLTAGE REGULATOR

STATEMENT OF GOVERNMENT INTEREST

The invention described herein may be manufactured and used by or for the Government of the United States for governmental purposes without the payment of any royalties thereon or therefor.

BACKGROUND OF THE INVENTION

The present invention relates to the field of floating gate semiconductor devices. More particularly, but without limitation thereto, the present invention is directed to limiting the voltage across a tunnel or injection oxide in a floating gate device.

An electrically programmable floating gate device, such as a non-volatile EEPROM cell or a non-volatile analog memory element, may comprise a floating gate insulated from a programming terminal by a dielectric across which electrical charge is injected or transferred. The rate of charge transfer across the dielectric to the floating gate during the application of a programming voltage depends on the charge resident on the floating gate. The resident charge influences the electric potential of the floating gate, and thus the voltage difference across the charge injection dielectric, in such a way as to oppose further injection of charge having the same polarity. The dependence of the injection current on the voltage across the charge injection dielectric is generally non-linear. Limiting or regulating the voltage across the charge injection dielectric is desirable in floating gate devices, such as non-volatile analog memory elements used in adaptive circuits, to insure that increments/decrements of charge on the floating gate are relatively constant over at least part of the range of total charge on the floating gate.

A need thus exists for a floating gate device that may be programmed with increments/decrements of charge without opposition from the resident charge on the floating gate. The present invention is directed to these needs and may provide further related advantages.

SUMMARY OF THE INVENTION

The embodiment described below of a floating gate device with injection voltage regulation is directed to analog memory elements, however such an embodiment of the present invention does not preclude other embodiments and advantages that may exist or become obvious to those skilled in the art.

A circuit for regulating floating gate injection voltage comprises a voltage regulator electrically coupled to a floating gate device. The floating gate device includes a dielectrically isolated, electrically conductive floating gate capacitively coupled to a programming terminal by an injection capacitance and to a bias terminal by a bias capacitance. The voltage regulator establishes a substantially constant rate of charge transfer onto the floating gate when a programming voltage is applied to the floating gate device and the voltage regulator.

An advantage of the present invention is to provide a floating gate device with an injection voltage regulation circuit that regulates the voltage of the floating gate.

A further advantage of the present invention is to provide a floating gate device such as an analog memory element with an injection voltage regulating circuit in order to establish a substantially constant charge transfer rate from the programming terminal to the floating gate.

The features and advantages summarized above in addition to other aspects of the present invention will become more apparent from the description, presented in conjunction with the following drawings.

DESCRIPTION OF THE INVENTION

The following description presents the best mode currently contemplated for practicing the present invention. This description is not to be taken in a limiting sense, but is presented solely for the purpose of disclosing how the present invention may be made and used. The scope of the invention should be determined with reference to the claims.

Figure 1A:
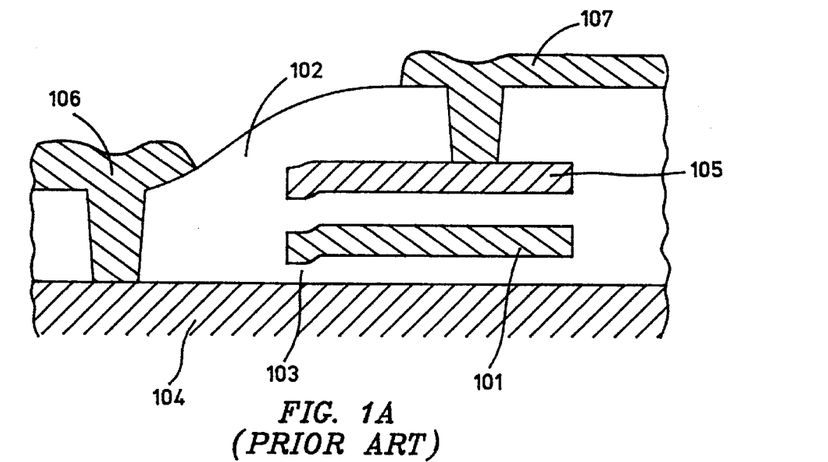
FIG. 1A depicts a cross-section of a prior art EEPROM type floating gate device.

Referring now to the drawings, FIG. 1A depicts a cross-section of an EEPROM where charge is injected or transferred to a floating gate. Floating gate 101 is composed of first-layer polysilicon which is electrically isolated by a surrounding dielectric 102. Dielectric 102 is relatively thin in region 103 between floating gate 101 and a crystalline semiconductor 104. The thickness of region 103 is typically less than 10 nm. A bias capacitor is formed by floating gate 101 and an adjacent piece of second-layer polysilicon 105 which is separated from floating gate 101 by dielectric 102. Second-layer polysilicon 105 is commonly referred to as a control gate.

A voltage is applied to crystalline silicon semiconductor 104 via contact with metal terminal 106 to control the potential of semiconductor 104 in region 103 of dielectric 102. A voltage is also applied to control gate 105 via contact with metal terminal 107. The voltage difference applied across metal terminals 106 and 107 is used to transfer charge across dielectric 102 in region 103 between floating gate 101 and crystalline semiconductor 104. Floating gate 101 may form the gate of a MOS transistor or transistors formed in crystalline semiconductor 104 (not shown).

Figure 1B:
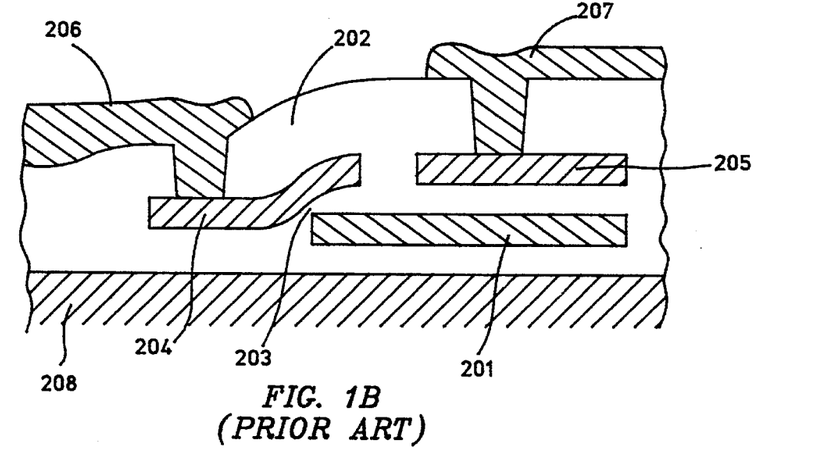
FIG. 1B depicts a cross-section of a prior art floating gate device having an overlap region between first and second polysilicon layers between which charge is transferred.

FIG. 1B depicts, in cross-section, another type of EEPROM structure which has been used to transfer charge to a floating gate. Floating gate 201 is composed of first-layer polysilicon electrically isolated by a dielectric 202. A first piece of second-layer polysilicon 204 overlaps the edge of floating gate 201 and is separated from floating gate 201 region 203 of dielectric 202.

A bias capacitor is formed by floating gate 201 and an adjacent second piece of second-layer polysilicon 205 which is separated from floating gate 201 by dielectric 202. The pieces of second-layer polysilicon 204 and 205 are contacted by metal terminals 206 and 207, respectively, by which voltages may be applied to second-layer polysilicon 204 and 205. The voltage difference applied across terminals 206 and 207 is used to transfer charge across region 203 of dielectric 202. While the mechanism of charge transfer is not fully understood in the art, it is thought to be tunneling. Floating gate 201 may form the gate of a MOS transistor or transistors in crystalline semiconductor 208 (not shown).

Figure 1C:
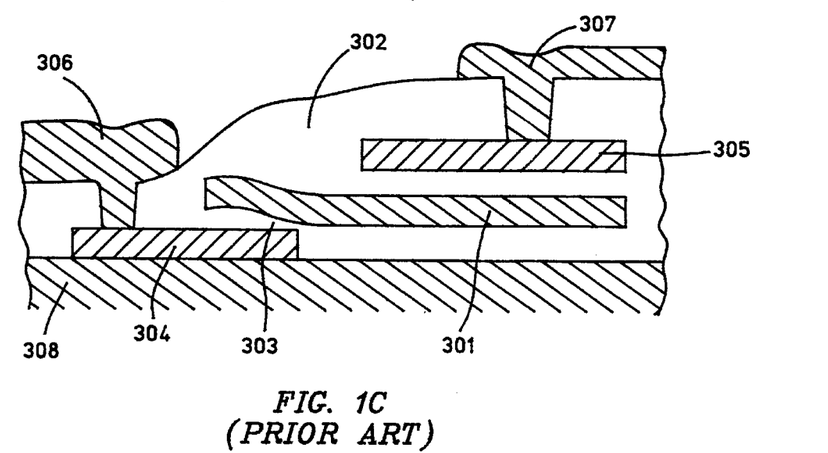
FIG. 1C depicts a cross-section of a prior art floating gate device fabricated in silicon-on-insulator with a MOS injection capacitor for charge transfer.

FIG. 1C depicts a cross-section of a structure for transferring charge to a floating gate in a silicon-on-insulator semiconductor device. Floating gate 301 is composed of first-layer polysilicon electrically isolated by dielectric 302. An island of crystalline silicon 304, situated on insulating substrate 308, is overlapped by a portion of floating gate 301. At the area of overlap, crystalline silicon island 304 is separated from floating gate 301 by a region 303 of dielectric 302. A bias capacitor is formed by floating gate 301 and adjacent piece of second-layer polysilicon 305 which is separated from floating gate 301 by dielectric 302. Crystalline silicon island 304 and second-layer polysilicon 305 are contacted by metal terminals 306 and 307, respectively, by which voltages may be applied to crystalline silicon island 304 and second-layer polysilicon 305.

A voltage difference applied across terminals 306 and 307 is used to effect charge transfer through region 303 of dielectric 302. The mechanism of charge transfer is thought to be hot carrier injection induced by deep depletion of crystalline silicon island 304, although tunneling may possibly occur at the edge of crystalline silicon island 304 overlapped by floating gate 301. Floating gate 301 may form the gate of a MOS transistor or transistors in crystalline silicon islands other than crystalline silicon island 304 (not shown).

Variations of the structures described with reference to FIGS. 1A, 1B, and 1C may be used. For instance, the bias capacitor in FIG. 1C formed by floating gate 301 and second-layer polysilicon 305 may be replaced by a MOS bias capacitor formed by floating gate 301 and a second island of crystalline silicon.

The devices depicted in FIGS. 1A, 1B and 1C, as well as their common variants, are topologically similar. Each possesses a floating gate (101, 201, 301), a programming terminal (106, 206, 306) and a bias terminal (107, 207, 307), with capacitive coupling of bias terminal (107, 207, 307) and programming terminal (106, 206, 306) to floating gate (101, 201, 301). In each case charge is transferred to floating gate (101, 201, 301) across an injection dielectric (103, 203, 303) by applying a sufficiently large programming voltage across bias terminal (107, 207, 307) and programming terminal (106, 206, 306).

Figure 1D:
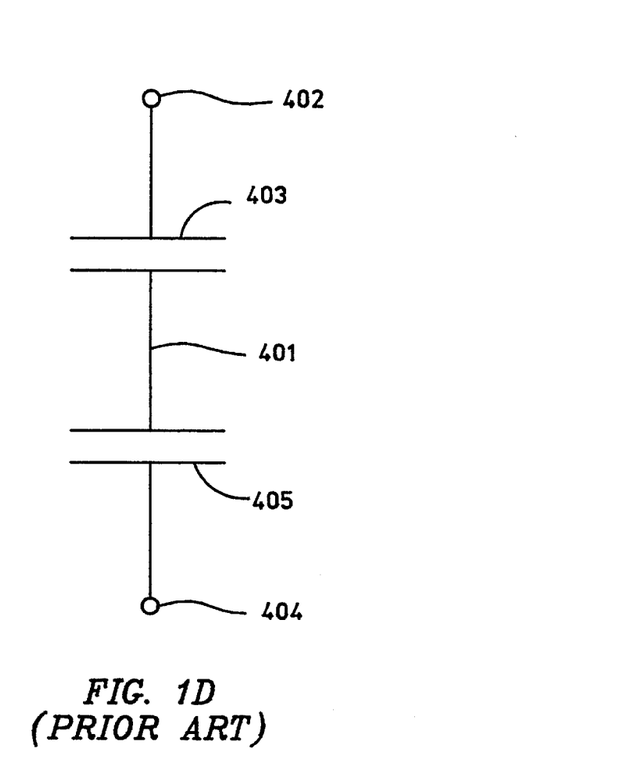
FIG. 1D is a schematic diagram generally representative of the devices in FIGS. 1A–1C.

The present invention is applicable to floating gate devices whose topology and operation are similar to those depicted in FIGS. 1A–1C. FIG. 1D is a schematic circuit diagram generally representative of this type of floating gate device, i.e., a floating gate 401 is capacitively coupled to a programming terminal 402 by an injection capacitor 403, and to a bias terminal 404 by a bias capacitor 405.

An important feature of the devices depicted in FIGS. 1A, 1B and 1C is that the magnitude of the electric current which charges floating gate (101, 201, 301) during application of the programming voltage across programming terminal (106, 206, 306) and bias terminal (107, 207, 307) is non-linearly dependent upon the potential difference between floating gate (101, 201, 301) and programming terminal (106, 206, 306). The present invention is designed to regulate the floating gate potential during programming to compensate for this nonlinear characteristic.

Figure 2A:
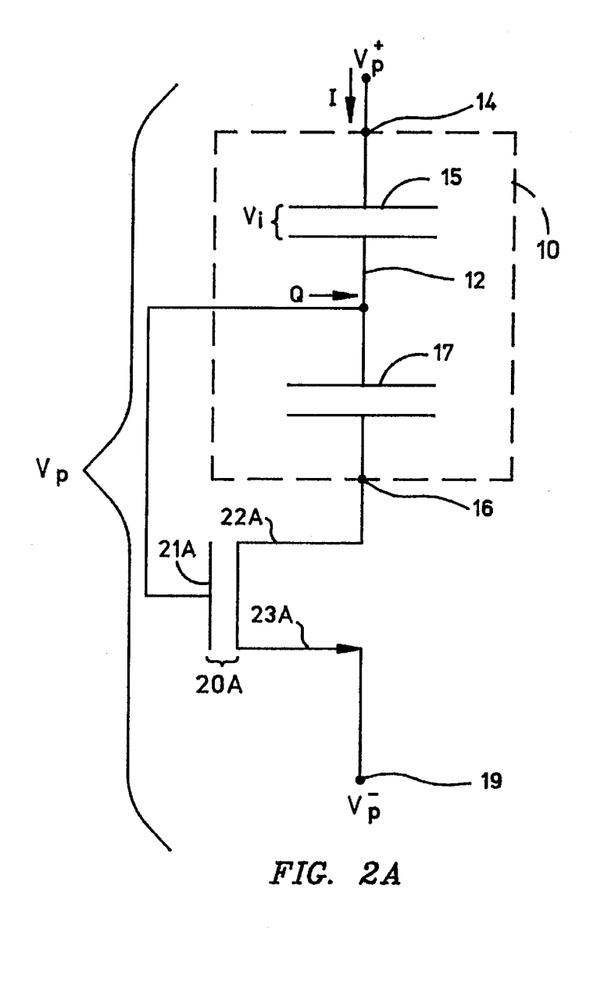
FIG. 2A is a schematic circuit diagram of a floating gate device configured for unipolar programming in combination with the n-channel regulating circuit of the present invention.
Figure 2B:
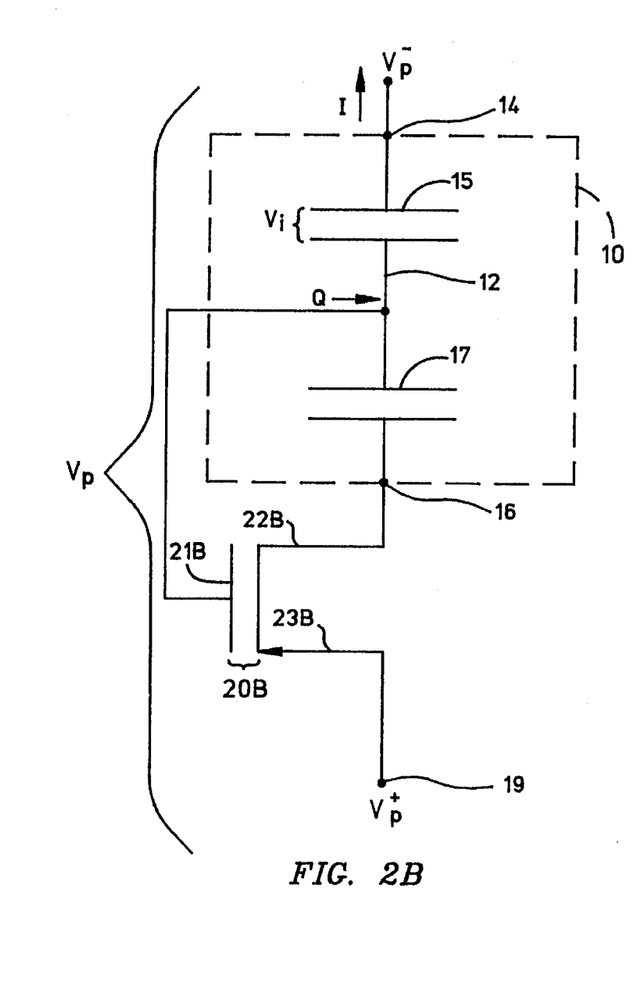
FIG. 2B is a schematic circuit diagram of a floating gate device configured for unipolar programming in combination with the p-channel regulating circuit of the present invention.

Two embodiments of the present invention are shown schematically in the circuit diagrams of FIGS. 2A and 2B in combination with a floating gate device 10 for unipolar programming. Unipolar programming is defined herein as changes of a single polarity in floating gate charge. Floating gate device 10 includes a dielectrically isolated conductive floating gate 12 capacitively coupled to a programming terminal 14 and a bias terminal 16. An injection capacitor 15 capacitively couples programming terminal 14 to floating gate 12 while a bias capacitor 17 capacitively couples bias terminal 16 to floating gate 12. The term "programming voltage" is used hereafter to refer to a potential difference $V_p = V_p^+ - V_p^-$ which is applied to transfer charge to or from floating gate 12.

In the embodiment of FIG. 2A, a field effect transistor 20A conducts an electric current upon application of the programming voltage to regulate the transfer of a net positive charge onto conductive floating gate element 12.

In the embodiment of FIG. 2B, a field effect transistor 20B conducts an electric current upon application of the programming voltage to regulate the transfer of a net negative charge onto conductive floating gate element 12.

In the circuit configuration shown in FIG. 2A, field effect transistor 20A regulates or limits a voltage $V_i$ across injection capacitor 15. Transistor gate 21A is electrically contiguous with conductive floating gate 12. Electrically contiguous is defined herein as comprising a series of electrically conducting elements in electrical contact with one another. The electrically conducting elements may in practice consist of different materials such as metal, polysilicon or a silicon island. Field effect transistor drain 22A is electrically coupled to bias terminal 16 and field effect transistor source 23A is electrically coupled to a return terminal 19.

Figure 3:
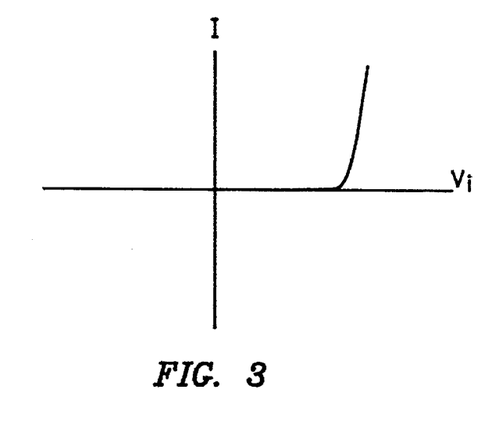
FIG. 3 is a graph of the rate of charge injection versus voltage across the injection capacitor of the floating gate device of FIG. 2A.

In the operation of the circuit of FIG. 2A, the programming voltage is sufficient to inject positive charge onto conductive floating gate 12. To regulate the programming voltage applied across the programming terminal and floating gate 12, field effect transistor 20A is preferably an n-channel device as shown. The rate of charge injection I onto floating gate 12 depends upon an injection voltage $V_i$ across injection capacitor 15 in a non-linear and approximately exponential fashion as represented in FIG. 3. For a given programming voltage, the electrical potential of floating gate 12 (referred to herein as $V_g$) is a function of the resident charge Q. The rate of charge transfer in device 10 consequently operates in the portion of the I versus $V_i$ according to the existing charge on floating gate 12. Accordingly, field effect transistor 20A limits voltage $V_i$ and thereby the rate of charge injection I. The operation of the p-channel regulating transistor in FIG. 2B is similar to that of FIG. 2A, except that the polarity is reversed.

Referring again to FIG. 2A, programming voltage $V_p$ is initially zero and conductive floating gate element 12 has a potential $V_Q$ due to resident charge Q. Regulation occurs when $V_Q < V_{Tn}$, where $V_{Tn}$ is the threshold voltage of n-channel field effect transistor 20A. As the programming voltage $V_p$ is applied, potential $V_g$ follows node $V_p^+$ as $V_g = (V_Q + V_p^+)$ until $(V_g - V_p^-)$ reaches $V_{Tn}$. At this point, n-channel regulating transistor 20A begins to conduct, charging bias capacitor 17. As $V_p$ increases, $V_g$ is maintained near $(V_{Tn} + V_p^-)$ so that voltage $V_i$ across injection capacitor 15 is limited to approximately $(V_p - V_{Tn})$ thereby limiting injection current flowing through injection capacitor 15.

Figure 4:
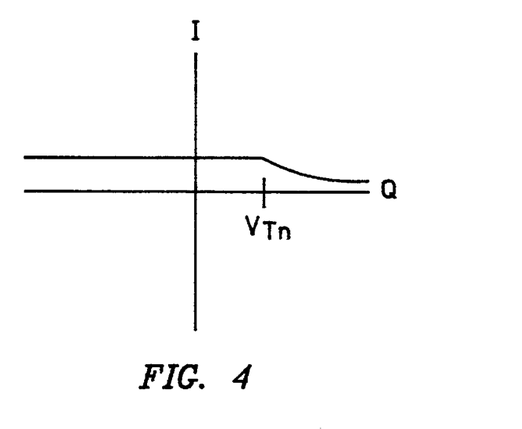
FIG. 4 is a graph of the rate of charge injection versus the charge on the conductive floating gate element of FIG. 2A.

If, on the other hand, $V_Q > V_{Tn}$, then n-channel regulating transistor 20A conducts immediately upon the application of $V_p$. This results in a potential $V_g = (V_Q + V_p^-)$ so that voltage $V_i$ across injection capacitor 15 is $(V_p - V_Q)$ and the floating gate voltage is not regulated. The resulting I versus Q curve is shown in FIG. 4, where the flat portion of the curve to the left of the $V_{Tn}$ point is indicative of current limiting through injection capacitor 15. At a voltage near $V_{Tn}$, the I vs. Q curve departs from the flat limiting region and begins to follow the curved characteristic to the right of the $V_{Tn}$ point, i.e., $V_{Tn}$ is approximately the point where the limiting effect ceases.

The present invention may be extended to other floating gate devices configured for bipolar programming, for example the "MOS Analog Memory Element with Injection Capacitors" described in the U.S. Pat. No. 5,253,196 issued on Oct. 12, 1993. Bipolar programming is defined herein as programming wherein the polarity of the voltage of the floating gate may change.

Figure 5:
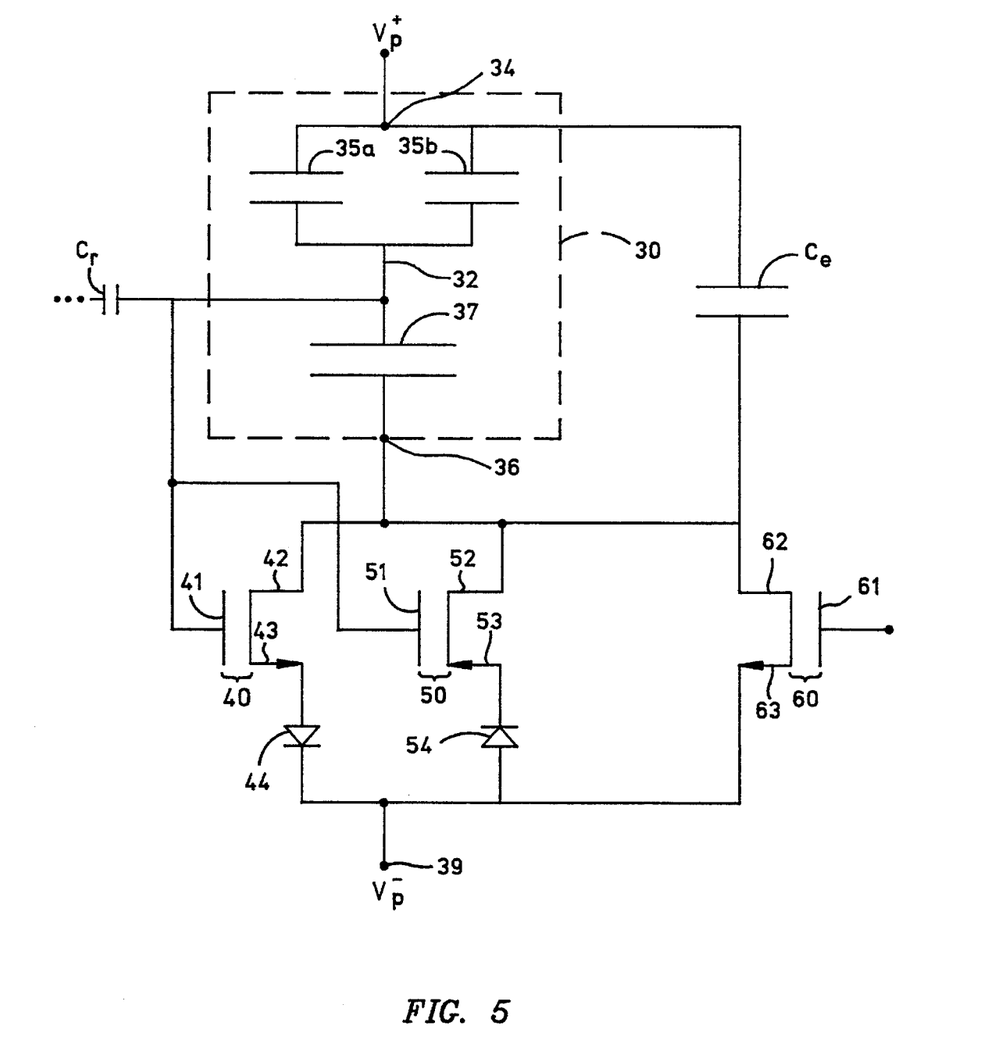
FIG. 5 is a schematic circuit diagram of a bipolar analog memory element in combination with a regulating circuit embodying the present invention.

FIG. 5 is a schematic diagram of a bipolar analog memory element comprising a floating gate device 30 having injection capacitors 35 in combination with a voltage regulator circuit of the present invention. Floating gate device 30 is characterized by a conductive floating gate 32 capacitively coupled to a programming terminal 34 and a bias terminal 36. Injection capacitors 35a and 35b capacitively couple programming terminal 34 to conductive floating gate 32, while a bias capacitor 37 capacitively couples bias terminal 36 to conductive floating gate 32.

Field effect transistors 40 and 50 limit the voltage $V_i$ across injection capacitors 35a and 35b. N-channel field effect transistor 40 conducts current through negative blocking diode 44 when $V_p$ is positive. Net positive charge is then transferred onto conductive floating gate 32 via injection capacitor 35a. P-channel field effect transistor 50 conducts current through positive blocking diode 54 when $V_p$ is negative. Net negative charge is then transferred onto conductive floating gate 32 via injection capacitor 35b. Transistor gates 41 and 51 are electrically contiguous with conductive floating gate 32. Transistor drains 42 and 52 are electrically coupled to bias terminal 36, and transistor sources 43 and 53 are electrically coupled to return terminal 39 via respective diodes 44 and 54.

Charge Q resident on conductive floating gate 32 may be detected by added circuitry that may introduce additional capacitance $C_r$ as represented in FIG. 5. To compensate for capacitance $C_r$, a second bias capacitor $C_e$ may be connected between terminals 34 and 36. The series combination of bias capacitor 37 and second bias capacitor $C_e$ preferably has a capacitance greater than the equivalent parallel capacitance of $C_r$ and injection capacitors 35a and 35b.

In addition, when programming of floating gate device 30 is complete, and $V_p$ returns to a reference potential, one of conducting transistors 40 and 50 may enter a subthreshold conductive state if the floating gate charge is such that the transistor is in the limiting region. The conducting transistor may then be unable to fully discharge bias capacitor 37. Accordingly, it may be desirable to provide a flush transistor 60 having a drain 62 electrically coupled to terminal 36, a source 63 electrically coupled to node 39, and a gate 61. Flush transistor 60 is depicted as an n-channel device in FIG. 5 by way of example. Other devices may be used, such as a p-channel device using well known circuit configurations. During programming, gate 61 is held at a potential which renders transistor 60 in a non-conductive state. After programming, gate 61 is biased to cause transistor 60 to switch to a conductive state to discharge bias capacitor 37.

During a phase of programming when programming voltage $V_p$ may be held substantially constant, the regulating device may be in a subthreshold or near-subthreshold conductive state. Drain current is then substantially equal to the injection current of the floating gate, which in general is very small compared to the optimum drain current. To increase the bias current for improved performance at greater bandwidths, it may be desirable to provide a drain bias current as suggested in FIG. 6A and implemented in the example shown in FIG. 6B.

Figure 6A:
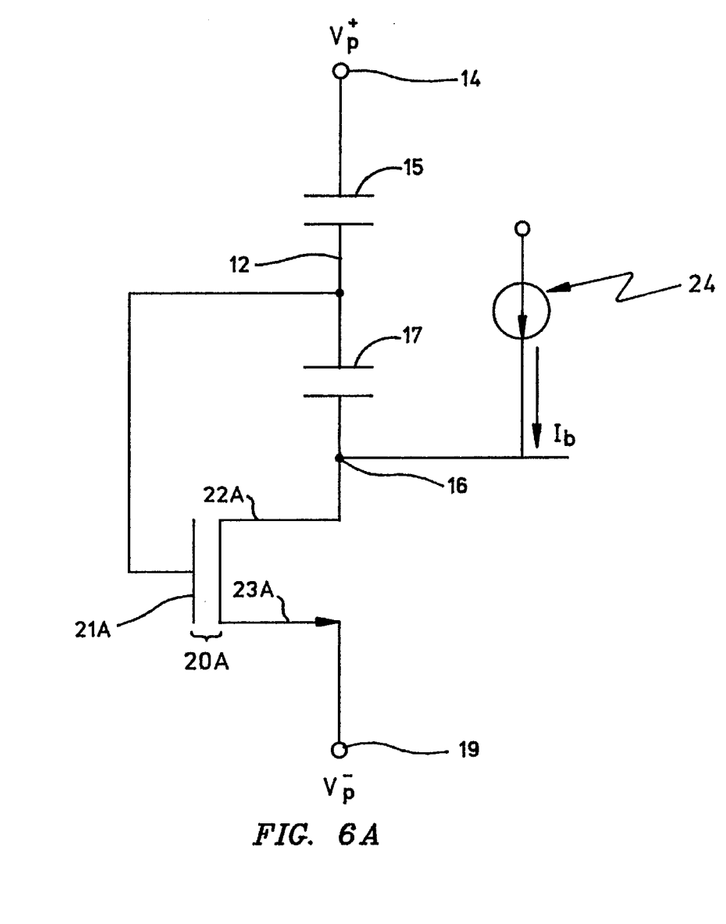
FIG. 6A is a schematic circuit diagram of a floating gate device in combination with a unipolar programming circuit embodying the present invention having an n-channel regulating device and a current source for biasing the regulating device.

FIG. 6A is analogous to FIG. 2A in that it depicts a regulating circuit for unipolar programming with positive programming voltage $V_p$. In this embodiment of the invention, a current source 24 supplies a current $I_b$ preferably substantially larger than the injection current to bias transistor 20A in a conductive state. The operation of the circuit shown in FIG. 6A is similar to that of the circuit shown in FIG. 2A, except that transistor 20A in FIG. 6A maintains a voltage on bias terminal 16 such that the floating gate voltage relative to source 23A biases the transistor to conduct a current equal to $I_b$.

Figure 6B:
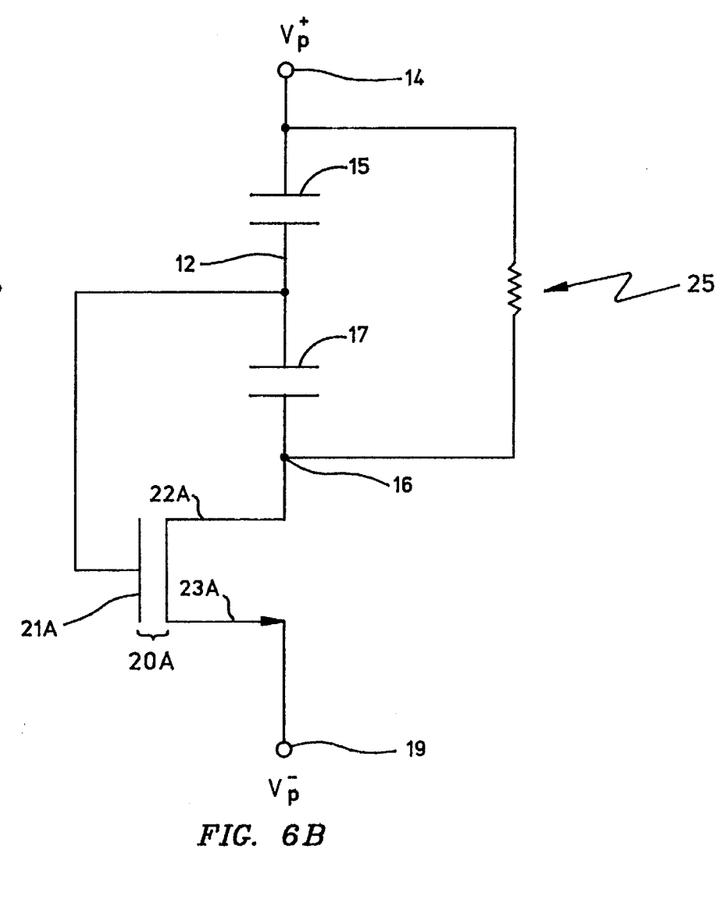
FIG. 6B is a schematic circuit diagram of a floating gate device in combination with a unipolar programming circuit embodying the present invention having an n-channel regulating device with an electrical resistance for biasing the regulating device.

An implementation of the circuit of FIG. 6A is depicted in FIG. 6B. An electrical resistance 25, which in practice may also comprise one or more active devices, is connected between a programming terminal 14 and a bias terminal 16. The conductance of resistance 25 is preferably less than the transconductance of field effect transistor 20A when in the regulating state, but sufficiently large so that when a programming voltage is applied, resistance 25 conducts a current that is substantially larger than the injection current onto floating gate 12.

Figure 7:
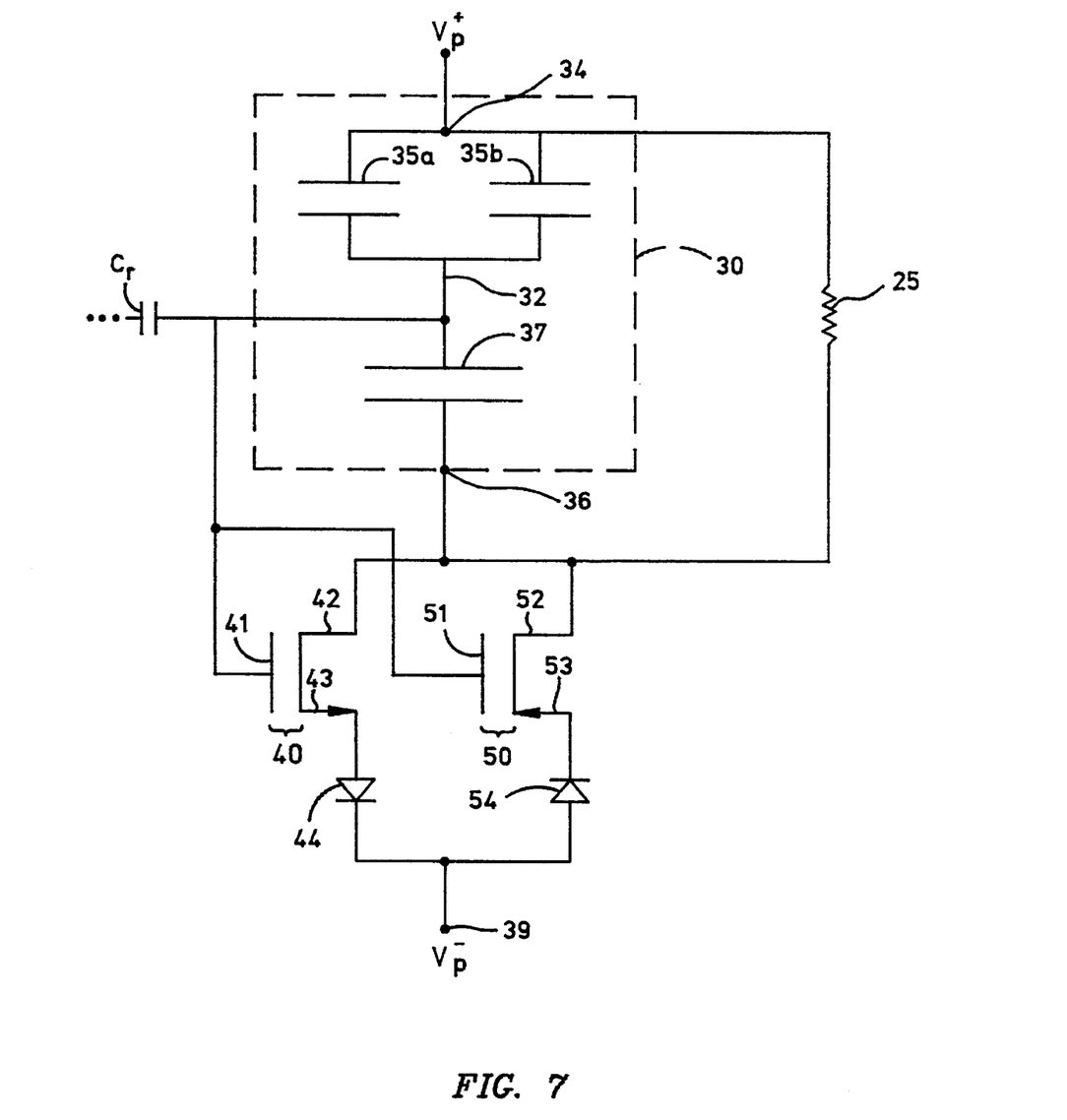
FIG. 7 is a schematic circuit diagram of a floating gate device in combination with a bipolar programming circuit embodying the present invention wherein the regulating devices are biased by an electrical resistance.

The current source of the present invention may also be applied to unipolar programming with a negative programming voltage or to bipolar programming as exemplified by the circuit of FIG. 7. A resistance 25 is connected between a programming terminal 34 and a bias terminal 36 to provide additional bias to one of field effect transistors 40 and 50. Resistor 25 ensures full discharge of capacitor 37, thus no additional bias capacitor and flush transistor are needed in this circuit.

Other modifications, variations, and applications of the present invention may be made in accordance with the above teachings other than as specifically described to practice the invention within the scope of the following claims.

I claim:

1. A circuit for regulating floating gate injection voltage, comprising:
   a floating gate device comprising an electrically conductive floating gate capacitively coupled to a programming terminal by an injection capacitance and to a bias terminal by a bias capacitance; and a voltage regulator electrically coupled to said floating gate device, wherein said voltage regulator establishes a substantially constant rate of charge onto said floating gate when a programming voltage is applied across said floating gate device and said voltage regulator.

2. The circuit of claim 1 further comprising a voltage source for applying a voltage to said floating gate device and said voltage regulator.

3. The circuit of claim 1 wherein said voltage regulator comprises a field effect transistor having a gate electrically contiguous with said floating gate, a drain electrically coupled to said bias terminal, and a source electrically coupled to a programming voltage return.

4. The circuit of claim 3, further comprising a current source electrically coupled to said drain for supplying a bias current to said drain.

5. The circuit of claim 4, wherein said current source comprises an electrical resistance electrically coupled between said programming terminal and said drain.

6. The circuit of claim 1, wherein said injection capacitance comprises positive and negative charge injection capacitors, wherein positive charge is transferred from said programming terminal through said positive injection capacitor to said floating gate when said programming voltage applied to said programming terminal is positive, and wherein negative charge is transferred from said programming terminal through said negative injection capacitor to said floating gate when said programming voltage applied to said programming terminal is negative.

7. The circuit of claim 1, wherein said voltage regulator an n-channel field effect transistor having a gate electrically contiguous with said floating gate, a drain electrically coupled to said bias terminal, and a source electrically coupled in series with a first diode electrically coupled in series with a programming voltage return terminal; said first diode having a polarity to block current flow through said n-channel field effect transistor when said programming voltage applied to said programming terminal is negative;

a p-channel field effect transistor having a gate electrically contiguous with said floating gate, a drain electrically coupled to said bias terminal, and a source electrically coupled in series with a second diode electrically coupled in series with said programming voltage return terminal; said second diode having a polarity to block current flow through said p-channel field effect transistor when said programming voltage applied to said programming terminal is positive.

8. The circuit of claim 7, further comprising a current source electrically coupled to said bias terminal for supplying a positive bias current to said drain of said n-channel field effect transistor when said programming voltage is positive, and a negative bias current to said drain of said p-channel field effect transistor when said programming voltage is negative.

9. The circuit of claim 8, wherein said current source comprises an electrical resistance electrically coupled between said programming terminal and said bias terminal.

10. A circuit for regulating floating gate injection voltage, comprising:

a floating gate device comprising an electrically conductive floating gate capacitively coupled to a programming terminal by an injection capacitance and to a bias terminal by a bias capacitance; and an injection voltage regulating transistor having a gate electrically contiguous with said floating gate device, a drain electrically coupled to said bias terminal, and a source electrically coupled to a programming voltage return terminal; wherein said injection voltage regulating transistor establishes a substantially constant rate of charge onto said floating gate when a programming voltage is applied across said programming terminal and said programming voltage return terminal.

11. The circuit of claim 10 further comprising a voltage source for applying a voltage across said programming terminal and said programming voltage return terminal.

12. The circuit of claim 10 wherein said injection capacitance comprises positive and negative charge injection capacitors, wherein positive charge is transferred from said programming terminal through said positive injection capacitor to said floating gate when said programming voltage applied to said programming terminal is positive, and wherein negative charge is transferred from said programming terminal through said negative injection capacitor to said floating gate when said programming voltage applied to said programming terminal is negative.

13. The circuit of claim 12 wherein said injection voltage regulating transistor comprises:

an n-channel field effect transistor having a gate electrically contiguous with said floating gate, a drain electrically coupled to said bias terminal, and a source electrically coupled in series with a first diode electrically coupled in series with a programming voltage return terminal; said first diode having a polarity to block current flow through said n-channel field effect transistor when said programming voltage applied to said programming terminal is negative;

a p-channel field effect transistor having a gate electrically contiguous with said floating gate, a drain electrically coupled to said bias terminal, and a source electrically coupled in series with a second diode electrically coupled in series with said programming voltage return terminal; said second diode having a polarity to block current flow through said p-channel field effect transistor when said programming voltage applied to said programming terminal is positive.

14. The circuit of claim 10 further comprising a current source electrically coupled to said bias terminal for supplying a bias current to said n-channel field effect transistor and to said p-channel field effect transistor.

15. The circuit of claim 14 wherein said current source comprises an electrical resistance electrically coupled between said programming terminal and said bias terminal.

* * * * *

UNITED STATES PATENT AND TRADEMARK OFFICE
CERTIFICATE OF CORRECTION

PATENT NO. : 5,481,492
DATED : January 2, 1996
INVENTOR(S) : Patrick A. Shoemaker It is certified that error appears in the above-identified patent and that said Letters Patent are hereby corrected as shown below:

On the title page: Item

[19] correct "Schoemaker" to -- Shoemaker --.

[75] correct "Schoemaker" to -- Shoemaker --.

Signed and Sealed this

Twenty-third Day of July, 1996

Attest:

BRUCE LEHMAN

Attesting Officer          Commissioner of Patents and Trademarks